United States Patent
Chen et al.

(10) Patent No.: US 9,123,872 B2
(45) Date of Patent: Sep. 1, 2015

(54) METHOD OF MANUFACTURING PACKAGE COMPONENT FOR LIGHT EMITTING DIODE AND PACKAGE STRUCTURE THEREOF

(71) Applicant: GENESIS PHOTONICS INC., Tainan (TW)

(72) Inventors: Cheng-Yen Chen, New Taipei (TW); Chun-Chieh Chin, Tainan (TW); Yun-Li Li, Taipei (TW)

(73) Assignee: GENESIS PHOTONICS INC., Tainan (TW)

( * ) Notice: Subject to any disclaimer, the term of this patent is extended or adjusted under 35 U.S.C. 154(b) by 0 days.

(21) Appl. No.: 14/510,758

(22) Filed: Oct. 9, 2014

(65) Prior Publication Data

US 2015/0097206 A1   Apr. 9, 2015

(30) Foreign Application Priority Data

Oct. 9, 2013 (TW) .............................. 102136507 A

(51) Int. Cl.
| | |
|---|---|
| *H01L 33/52* | (2010.01) |
| *H01L 33/50* | (2010.01) |
| *H01L 33/00* | (2010.01) |
| *H01L 33/48* | (2010.01) |
| *H01L 33/54* | (2010.01) |
| *H01L 33/56* | (2010.01) |
| *H01L 31/0203* | (2014.01) |
| *H01L 51/52* | (2006.01) |
| *F21K 99/00* | (2010.01) |

(52) U.S. Cl.
CPC .............. *H01L 33/52* (2013.01); *H01L 33/005* (2013.01); *H01L 33/48* (2013.01); *H01L 33/483* (2013.01); *H01L 33/50* (2013.01); *H01L 33/501* (2013.01); *H01L 33/505* (2013.01); *H01L 33/54* (2013.01); *H01L 33/56* (2013.01); *F21K 9/90* (2013.01); *H01L 31/0203* (2013.01); *H01L 51/5237* (2013.01)

(58) Field of Classification Search
CPC ..... H01L 33/005; H01L 33/48; H01L 33/483; H01L 33/50; H01L 33/501; H01L 33/52; H01L 33/54; H01L 33/56; H01L 31/0203; H01L 51/5237; F21K 9/90
See application file for complete search history.

(56) References Cited

U.S. PATENT DOCUMENTS

2010/0193821 A1* 8/2010 Fukasawa et al. .............. 257/98

* cited by examiner

*Primary Examiner* — Armando Rodriguez
(74) *Attorney, Agent, or Firm* — Muncy, Geissler, Olds & Lowe, P.C.

(57) ABSTRACT

A method of manufacturing package component for light emitting diode (LED) is disclosed. At least one LED is disposed on a substrate inside a photocuring resin, wherein the LED is covered completely by the substrate and the photocuring resin. Power is provided to the LED to make the LED emit plural light beams such that a portion of the photocuring resin is cured by the light beams to obtain a male mold. A separation process is performed to separate the male mold and the other portion of the photocuring resin, the LED and the substrate. A rollover process is performed to manufacture the female mold by the male mold, wherein the female mold has at least one accommodation space with a shape identical to that of the male mold. A forming process is performed to form a package component with a shape identical to that of the male mold.

14 Claims, 11 Drawing Sheets

METHOD OF MANUFACTURING PACKAGE COMPONENT FOR LIGHT EMITTING DIODE AND PACKAGE STRUCTURE THEREOF

CROSS-REFERENCE TO RELATED APPLICATION

This application claims priority from Taiwan Patent Application No. 102136507, filed on Oct. 9, 2013, in the Taiwan Intellectual Property Office, the content of which are hereby incorporated by reference in their entirety for all purposes.

BACKGROUND OF THE INVENTION

1. Field of the Invention

The present invention relates to a manufacturing method and a package structure, in particular with respect to a method of manufacturing package component for light emitting diode and a package structure thereof.

2. Description of the Related Art

When facing the global energy shortage, high oil price and electricity bill, and to respond to the government's policies of energy conservation and saving energy and reducing carbon emission, power-saving lighting technology has become the mainstream, and many technique developers are engaging in developing replacement for the conventional illumination source, as well as the substitute for low power consumption. Wherein, the lighting technology of light emitting diode (LED) has become the developing product of the greatest potential in substitute illumination source.

LED has advantages of smaller volume, longer service life and lower power consumption and so on; therefore, it is commonly applied to the indicator and display of 3C products. As a result, for the sake of promoting the competitiveness of the marketing, the related industries of LED are keen on to boost the production yield rate and reduce the manufacturing cost so as to enhance the advantage themselves.

When performing the LED package manufacturing process, it usually uses methods of spraying or dispensing to directly dispose the package material to each LED, and a curing process is subsequently used to cure the package material to form the package layer so as to accomplish the conventional LED package structure. However, in steps of each spraying or dispensing, as the uncured package material is often in liquid state or gel state, the amount of the package material on the LED and the cured shape and thickness are normally not consistent with each other, it is easy to cause quality of the obtained package structure of LED not the same such that the brightness or chrominance thereof are affected. Furthermore, as LED is of directional light type, the luminous intensities of positive direction light and side direction light are different; when fluorescent substances are doped inside the package material, it is unable to make changes of the package material according to each luminous intensities of light direction (i.e. thickness), causing the problem of uneven light color of light emission and great difference of light color distribution. Consequently, as far as those industries which need to make mass production of LED package structure are concerned, it is indeed an obstacle at present.

SUMMARY OF THE INVENTION

In view of the aforementioned technical problems of the prior art, purposes of the present invention are to provide a method of manufacturing package component for light emitting diode and a package component thereof to resolve the shortcomings of the conventional LED package manufacturing process lacking for consistent quality, as well as to promote the uniformity of light color of LED's light emission.

In order to accomplish the preceding purpose, the present invention provides a method of manufacturing package component for light emitting diode, and the method comprises: disposing at least one light emitting diode disposed on a substrate inside a photocuring resin, wherein the light emitting diode is covered completely by the substrate and the photocuring resin; providing a power to the light emitting diode to make the light emitting diode emit a plurality of light beams such that a portion of the photocuring resin is cured by the light beams to obtain a male mold; performing a separation process to separate the male mold and the other portion of the photocuring resin, the light emitting diode and the substrate; performing a rollover process to manufacture the female mold by the male mold, wherein the female mold may have at least one accommodation space with a shape identical to that of the male mold; and performing a forming process by utilizing the accommodation space to form a package component with a shape identical to that of the male mold. Wherein the forming process may comprise an injection forming process, or filling a colloid in the accommodation space of the female mold, and performing a thermal curing process or a thermoforming process to make the colloid form a package component with a shape identical to that of the male mold. Wherein a wavelength conversion material or a light scattering material is comprised inside the package component. Wherein the colloid is silica gel or epoxy resin.

According to another preferred embodiment of a method of manufacturing package component for light emitting diode of the present invention, the method further comprises performing a cleaning process to the male mold between the separation process and the rollover process to remove the residual photocuring resin on the male mold. Wherein the cleaning process utilizes an organic solvent to clean the male mold.

In addition, the present invention further provides a package structure comprising: a substrate, at least one light emitting diode disposed on the substrate, and a package component covering the light emitting diode, wherein the package component may be obtained by a method of manufacturing package component for light emitting diode according to any of the aforementioned methods. Wherein each light emission point of the plurality of light beams emitted by the light emitting diode on a surface of the package component are identical in luminous intensity.

According to another preferred embodiment of a package structure of the present invention, a package structure of the present invention further comprises an adhesive layer disposed between the light emitting diode and the package component.

In accordance with the preceding description, a method of manufacturing package component for light emitting diode and package structure thereof of the present invention may have one or more following advantages:

(1) A method of manufacturing package component for light emitting diode of the present invention is able to effectively produce package component with consistent quality so as to accomplish purpose of mass production of package components having good quality by the female mold manufactured by the male mold obtained from the light emitting diode emitting light itself In addition, according to the female mold manufactured by the male mold obtained from diverse light types of the LED emitting light itself, it can manufacture the desirable package component based on each luminous intensity of the light direction to enable the light color of the light emission being more uniform.

(2) A package structure of the present invention is obtained from a method of manufacturing package component for light emitting diode of the present invention, which is able to resolve the shortcomings of the conventional LED package manufacturing process lacking for consistent quality, as well as to promote the uniformity of light color LED's light emission so as to boost the specification of the LED package structure.

DETAILED DESCRIPTION OF THE PREFERRED EMBODIMENTS

Figure 1:
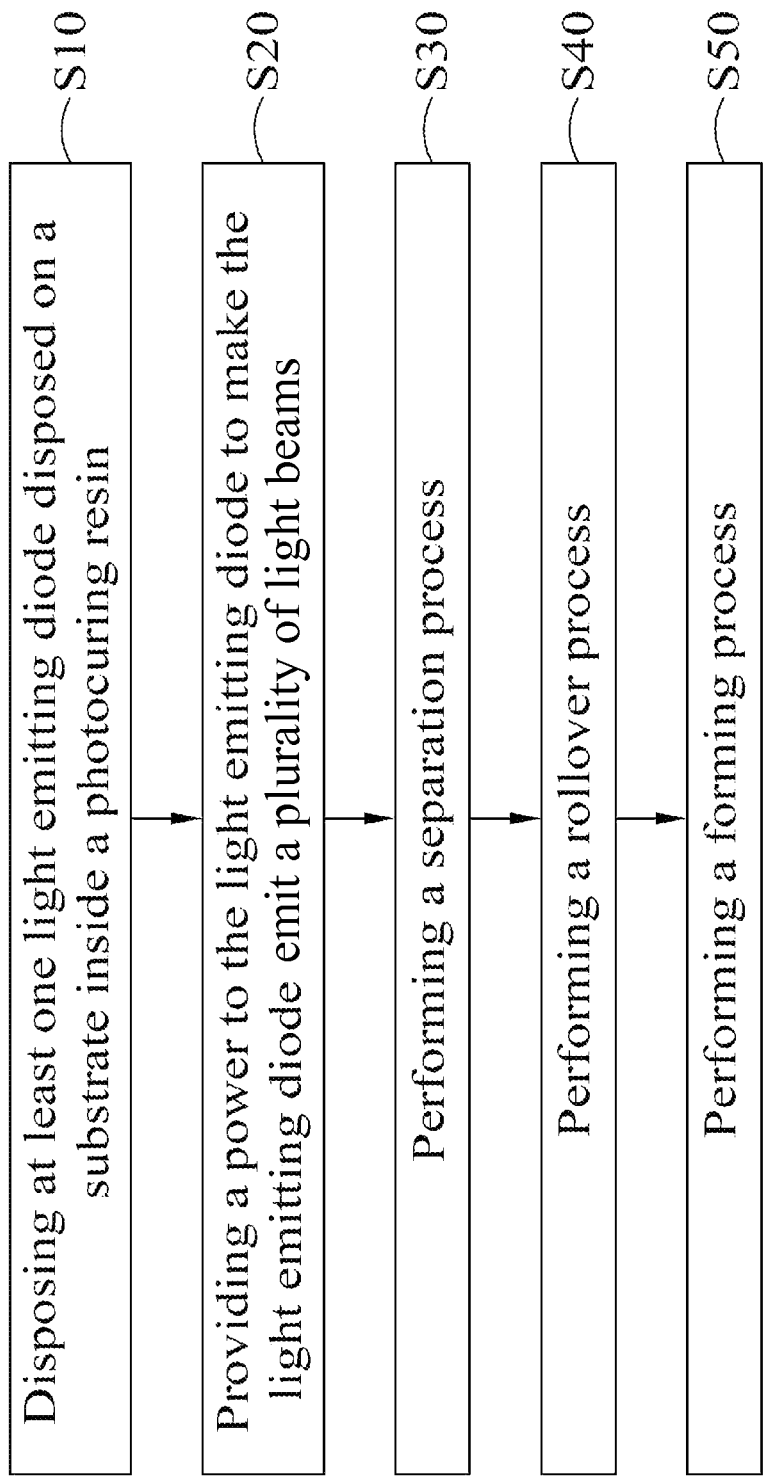
FIG. 1 is a flow chart of a first preferred embodiment of a method of manufacturing package component for light emitting diode of the present invention.

Please refer to FIG. 1 which is a flow chart of a first preferred embodiment of a method of manufacturing package component for light emitting diode of the present invention. As shown in FIG. 1, in the first preferred embodiment of a method of manufacturing package component for light emitting diode of the present invention, the method of manufacturing package component for light emitting diode at least comprises steps of: S10, S20, S30, S40 and S50. In step S10: disposing at least one light emitting diode disposed on a substrate inside a photocuring resin, wherein the light emitting diode is covered completely by the substrate and the photocuring resin; in step S20: providing a power to the light emitting diode to make the light emit diode emit a plurality of light beams such that a portion of the photocuring resin is cured by the light beams to obtain a male mold; in step S30: performing a separation process to separate the male mold and the other portion of the photocuring resin, the light emitting diode and the substrate; in step S40: performing a rollover process to manufacture the female mold by the male mold, wherein the female mold has at least one accommodation space with a shape identical to that of the male mold; and in step S50: performing a forming process by utilizing the accommodation space to form a package component with a shape identical to that of the male mold. Wherein the forming process may comprise, for example, an injection forming process to form a package component with a shape identical to that of the male mold; or filling a colloid in the accommodation space of the female mold, and performing a thermal curing process or a thermoforming process to make the colloid form a package component with a shape identical to that of the male mold, but it shall not be subject to this restriction. Any forming processes which are able to form a package component with a shape identical to that of a male mold by utilizing an accommodation space belongs to the protected scope claimed by the present invention.

Figure 2:
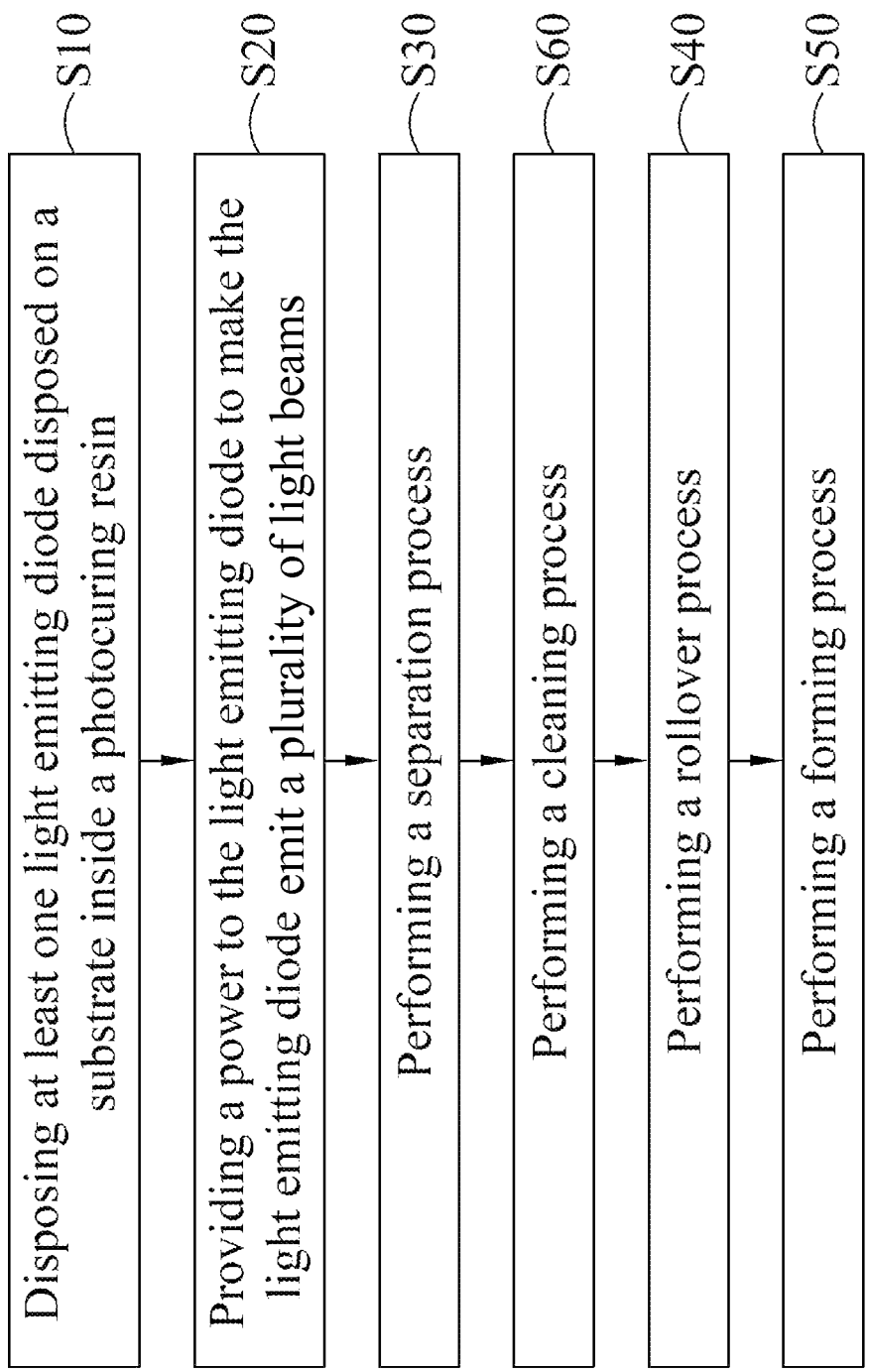
FIG. 2 is a flow chart of a second preferred embodiment of a method of manufacturing package component for light emitting diode of the present invention.

Please refer to FIG. 2 which is a flow chart of a second preferred embodiment of a method of manufacturing package component for light emitting diode of the present invention. As shown in FIG. 2, in the second preferred embodiment of a method of manufacturing package component for light emitting diode of the present invention, the method of manufacturing package component for light emitting diode at least comprises steps of: S10, S20, S30, S40, S50 and S60. The difference between the first and the second preferred embodiments of a method of manufacturing package component for light emitting diode of the present invention merely is: in the second preferred embodiment, the method further comprises performing a cleaning process S60 to the male mold between the separation process and the rollover process to remove the residual photocuring resin on the male mold. In step S60: the cleaning process utilizes, for example, an organic solvent to clean the male mold. Wherein, the organic solvent may be, for example, acetone, but it shall not be subject to this restriction. Any solvents or solutions which are able to resolve or remove the residual photocuring resin on the male mold belongs to the protected scope claimed by the present invention.

With respect to steps S10, S20, S30, S40 and S50 stated in the first and the second preferred embodiments of a method of manufacturing package component for light emitting diode of the present invention, please refer to FIG. 3 to FIG. 8 simultaneously for the clear explanations.

Figure 3:
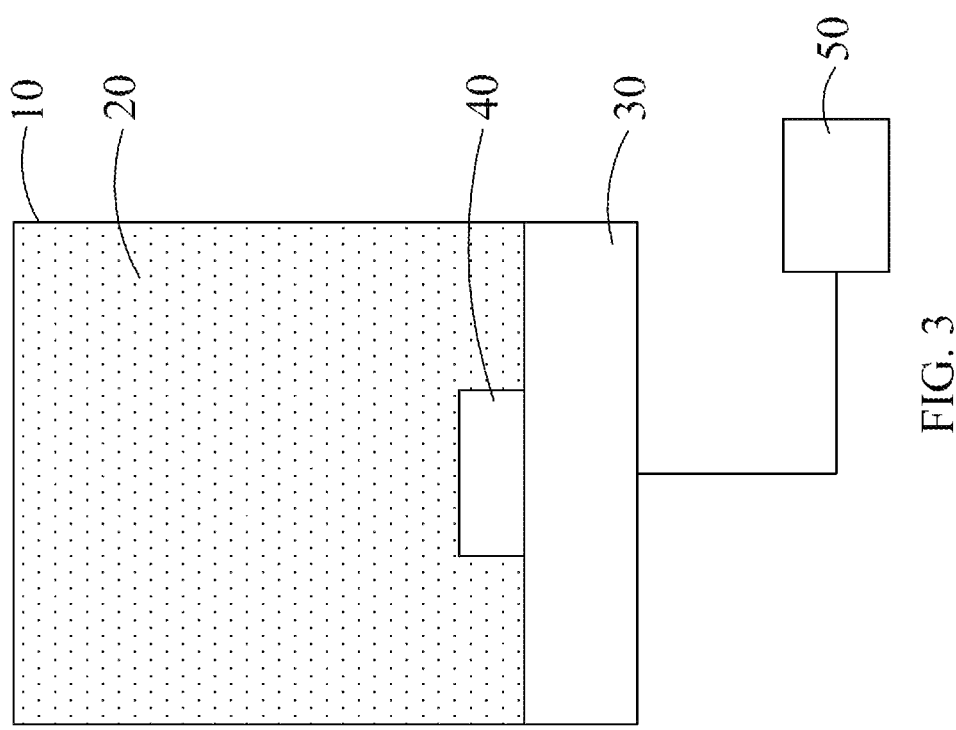
FIG. 3 to FIG. 8 are schematic diagrams of operation of a method of manufacturing package component for light emitting diode of the present invention.

FIG. 3 to FIG. 8 are schematic diagrams of operation of a method of manufacturing package component for light emitting diode of the present invention. Firstly, as shown in FIG. 3, an accommodation tank 10 is provided, and a photocuring resin 20 is disposed in the accommodation tank 10, and then disposing at least one light emitting diode 40 disposed on a substrate 30 inside a photocuring resin 20 (step S10) such that the light emitting diode 40 is covered completely by the substrate 30 and the photocuring resin 20. In addition, a power supply unit 50 is further provided to electrically connect with the light emitting diode 40. The power supply unit 50 is, for example, electrically connected to substrate 30, and the substrate 30 is electrically connected to the light emitting diode 40, but it shall not be subject to this restriction. Wherein, the photocuring resin 20 can be UV resin or visible light resin, but it shall not be subject to this restriction. User can choose a photocuring resin based on light beam's wavelength emitted by a light emitting diode. Any resin materials which are able to cure light beams emitted by a light emitting diode belongs to the protected scope claimed by the present invention.

Figure 4:
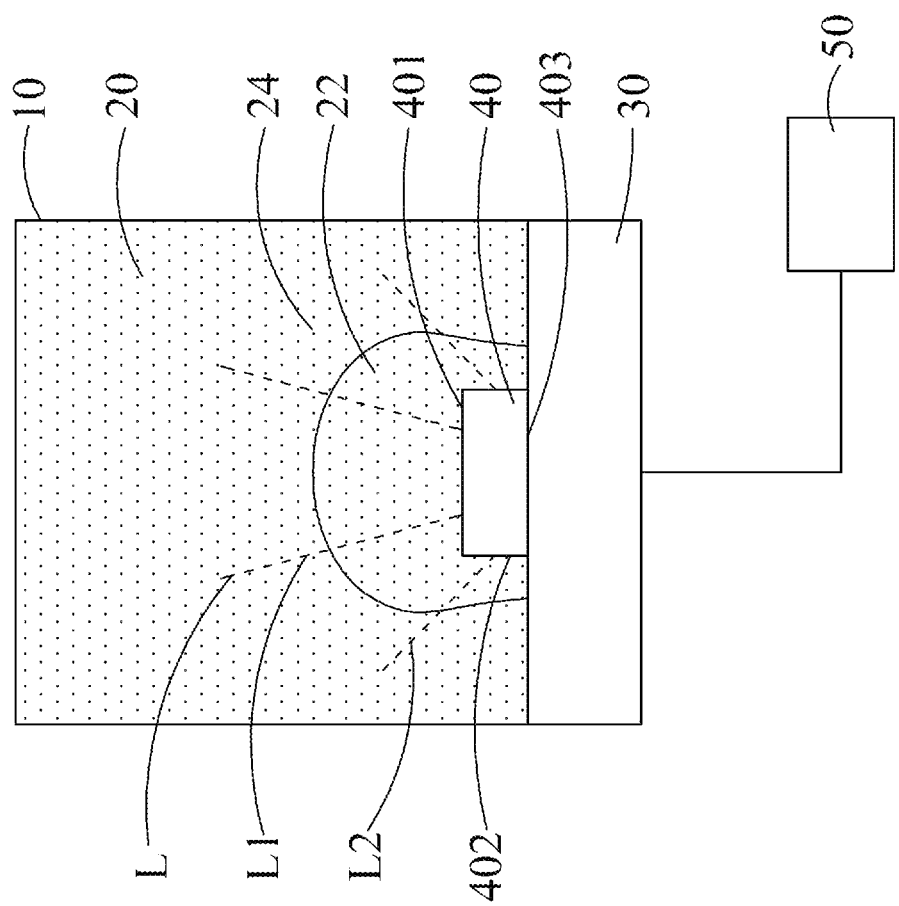

Subsequently, please refer to FIG. 4 which demonstrates providing a power to the light emitting diode 40 to make the light emitting diode 40 emit a plurality of light beams L (step S20) such that a portion of the photocuring resin 20 is cured by the light beams L. Wherein, period of the portion of the photocuring resin 20 being cured by the light beams L can be, for example, within a range between 1 sec and 70 sec. Namely, after the light emitting diode 40 emitting light beams L by about 1 sec to 70 sec, a portion of the photocuring resin 20 is totally cured into a solid state from a gel state (or liquid state) to become the male mold 22. In addition, as shown in FIG. 4, the light emitting diode 40 has a upper surface 401 away from the substrate 30, a plurality of side surfaces 402 connecting with the upper surface 401 and a lower surface 403 connecting with the side surfaces 402 and the substrate 30; besides, as the light emitting diode 40 has directivity when emitting light beams, among the light beams L emitted by the light emitting diode 40, the luminous intensity of the light beams L1 emitted from the upper surface 401 is greater than that of the light beams L2 emitted from the side surfaces 402.

Figure 5:
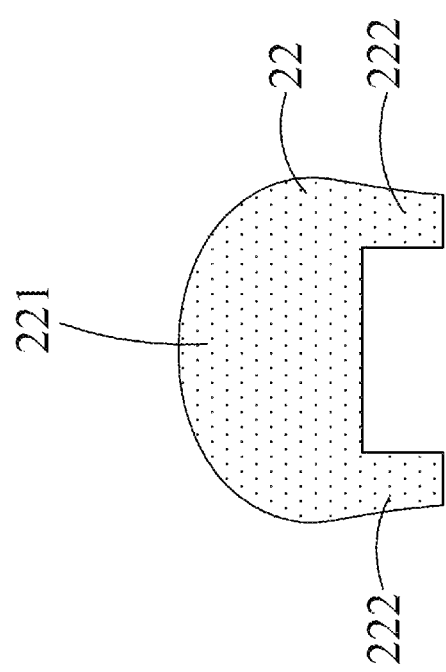

After a portion of the photocuring resin 20 is totally cured into a solid state from a gel state (or liquid state) to become the male mold 22, step S30 is conducting to perform a separation process so as to separate the male mold 22 and the other portion 24 of the photocuring resin 20, the light emitting diode 40 and the substrate 30. As shown in FIG. 5, the obtained male mold 22 by the step S30 has a top portion 221 and a side portion 222. In this embodiment, among the light beams L emitted by the light emitting diode 40, as the luminous intensity of the light beams L1 emitted from the upper surface 401 is greater than that of the light beams L2 emitted from the side surfaces 402 (as shown in FIG. 4), thickness of the top portion 221 of the male mold 22 is greater than that of the side portion 222 of the male mold 22, and as each light direction intensity of the light emitting diode 40 is not the same with each other, the formed surface of the male mold 22 is slightly unsmooth. Because light emitting types of various light emitting diodes are not consistent with each other, shape of the male mold 22 is different from each other due to the intensity of the light irradiation, but it shall not be subject to this restriction. After S30 is completed, the cleaning process S60 is further performed to remove the residual photocuring resin which is uncured on the male mold 22 (refer to FIG. 2). Wherein, an organic solvent, such as acetone can be used to clean the male mold 22 in step S60.

Figure 6:
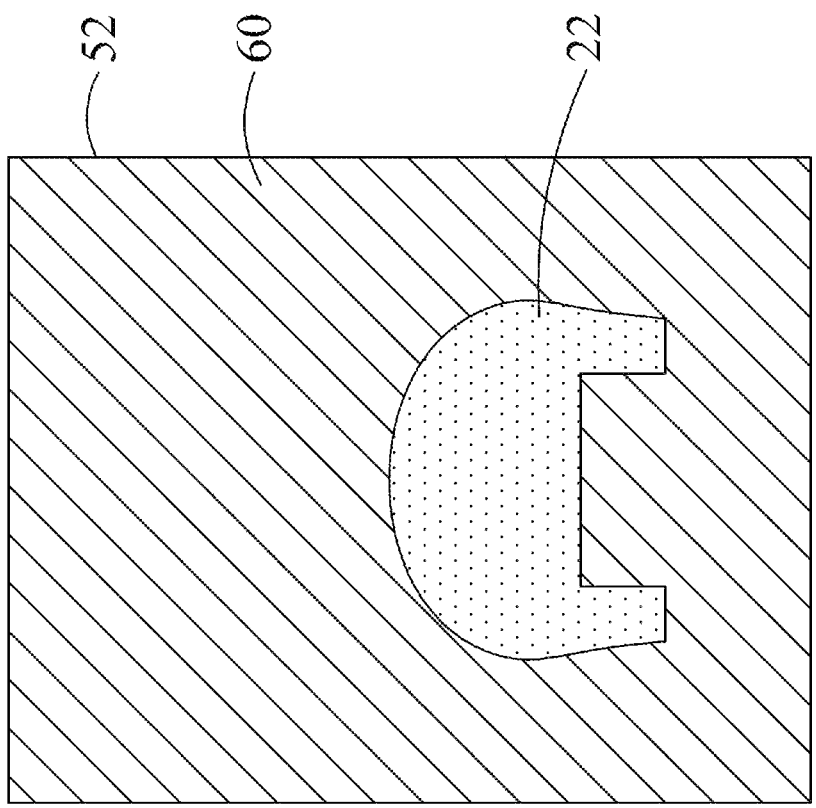
Figure 7:
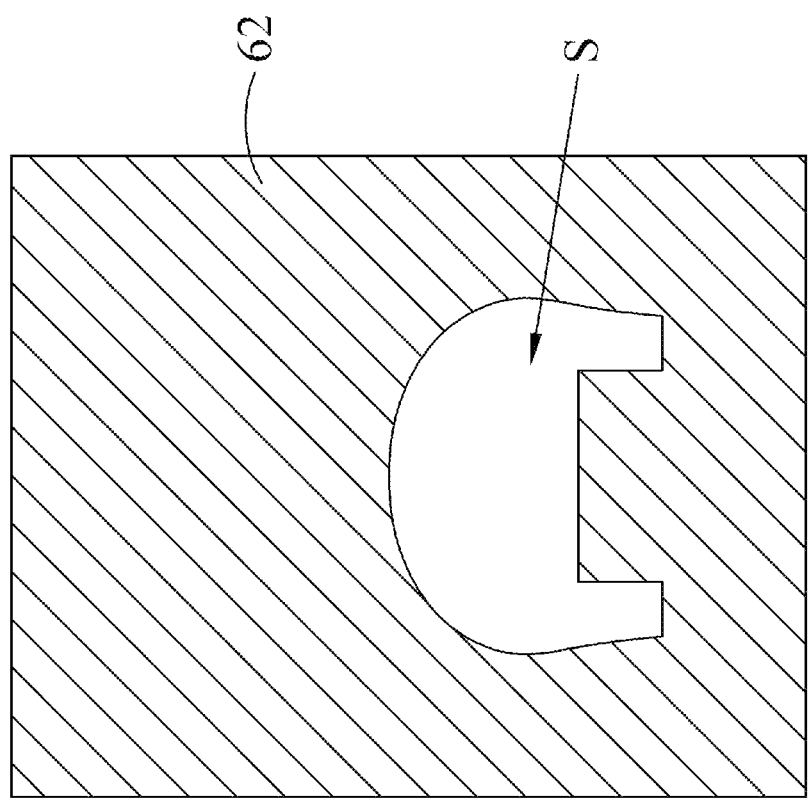
Figure 8:
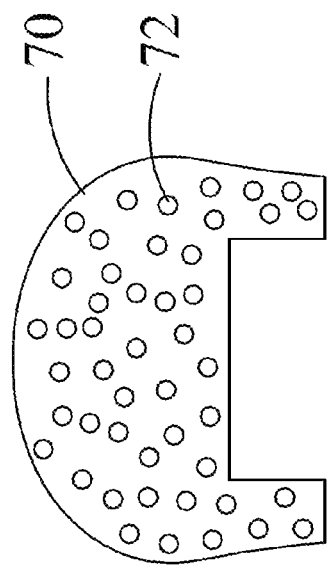

Next, as shown in FIG. 6 and FIG. 7, a rollover process (S40) is performed to manufacture the female mold by the male mold 22. The rollover process is to provide a accommodation tank 52, and a female mold material 60 is disposed in the accommodation tank 52, and then disposing the male mold 22 inside the female mold material 60, and separating the female mold 62 and the male mold 22 after the female mold material 60 is cured to form the female mold 62. The rollover process can use an injection forming process to form the female mold 62, but it shall not be subject to this restriction. Please refer to FIG. 7, and as shown in the FIG. 7, the female mold 62 has one accommodation space S with a shape identical to that of the male mold 22. It can, of course, form multiple accommodation spaces S with a shape identical to that of the male mold 22 on the same female mold 62 depending on the situations to save manufacture cost for the follow-up steps and the time. Moreover, performing a forming process (step S50) to form a package component 70 with a shape identical to that of the male mold 22 by utilizing the accommodation space S. Wherein, the forming process can be such as an injection forming process, or filling a colloid in the accommodation space S of the female mold 62, and performing a thermal curing process or a thermoforming process to make the colloid form the package component 70 with a shape identical to that of the male mold 22, but it shall not be subject to this restriction. Wherein, the colloid is silica gel or epoxy resin for instance, but it shall not be subject to this restriction. Wherein, the period of the forming process can be such as with a range between half hour and 5 hours. The package component 70 obtained from a method of manufacturing package component for light emitting diode of the present invention can be seen in FIG. 8, and an additive material 72 is further comprised inside the package component 70 according to the needs, such as a wavelength conversion material or a light scattering material to change physical feature (i.e. wavelength or scattering property) of the package component 70 which is penetrated by light beams. Wherein, the wavelength conversion material or the light scattering material is mixed to add in the forming process; such as being mixed to add in the colloid and then to be cured and form the package component 70, but it shall not be subject to this restriction.

A method of manufacturing package component for light emitting diode of the present invention is to obtain the male mold 22 by the light emitting diode 40 emitting light beams itself, and to manufacture the female mold 62 by the male mold 22, and then the female mold 62 is used to manufacture the multiple package components 70 of consistent quality. Therefore, the size (i.e. thickness or size) and physical feature of the obtained multiple package components 70 are both the same, and the technical problem of the package component obtained from the conventional LED manufacturing process lacking for consistent quality is thereby solved. Moreover, as the light types emitted by diverse LEDs are not the same with each other, using the conventional package method is possible to cause problem concerning that the light beams of different light directions penetrated by the package component have uneven light color of light emission and great difference of the light color distribution. Using a method of manufacturing package component for light emitting diode of the present invention is to manufacture the female mold by the male mold obtained from the light type of the LED emitting light beams itself, and the necessary package component obtained from every light direction's luminous intensity has a thicker light direction thickness in light intensity and a weaker light direction thickness in disphotic so that the light color of light beams becomes more uniform.

Figure 9:
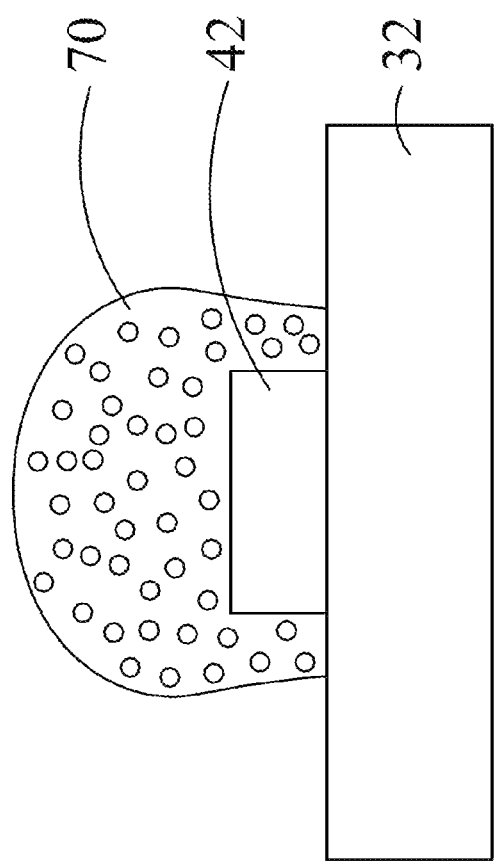
FIG. 9 is a schematic diagram of a first preferred embodiment of a package structure of the present invention.

Please refer to FIG. 9 which is a schematic diagram of a first preferred embodiment of a package structure of the present invention. As shown in FIG. 9, in the first preferred embodiment of a package structure of the present invention, the package structure comprises a substrate 32, at least one light emitting diode 42 disposed on the substrate 32, and a package component 70 covering the light emitting diode 42. Wherein, the package component 70 is obtained by the first or the second preferred embodiment of a method of manufacturing package component for light emitting diode according to any of aforementioned methods. Wherein, each light emission point of the plurality of light beams emitted by the light emitting diode 42 on a surface of the package component 70 are identical in luminous intensity; that is to say, after the emitted light from the light emitting diode 42 passing through the package component 70, each light emission point of each light direction is uniform. In addition, if a wavelength conversion material is added in the package component 70, the package component 70 is a wavelength conversion component having wavelength conversion function. For example, if yellow fluorescent powder is added into the package component 70 and the light emitting diode 42 is a light emitting diode emitting blue light, when the light beams passing through the package component 70 activate the yellow fluorescent powder, the package structure emits white light. Because the package component 70 of the present invention is manufactured based on the luminous intensity of each light direction, optimizing the uniformity of the white light is more applicable to be applied to illumination lamps such as light bulb and so on.

Figure 10:
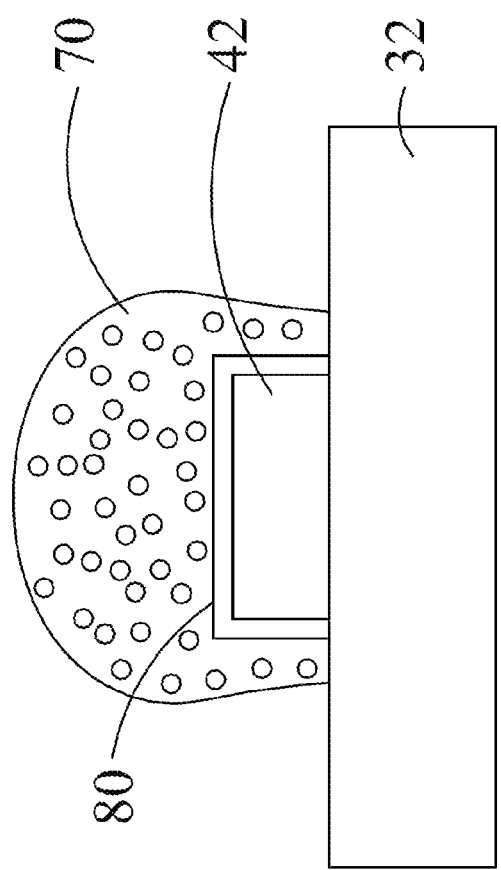
FIG. 10 is a schematic diagram of a second preferred embodiment of a package structure of the present invention.

In addition, as shown in FIG. 10, in the second preferred embodiment of a package structure of the present invention, the package structure of the present invention further comprises an adhesive layer 80 disposed between the light emitting diode 42 and the package component 70, and the adhesion of the adhesive layer 80 is used to fix the package component 70 on the light emitting diode 42. Wherein, the material of the adhesive layer 80 can be such as silica gel or epoxy resin, but it shall not be subject to this restriction. Any materials which are able to provide adhesion to the adhesive layer 80 belongs to the protected scope claimed in the present invention.

Figure 11:
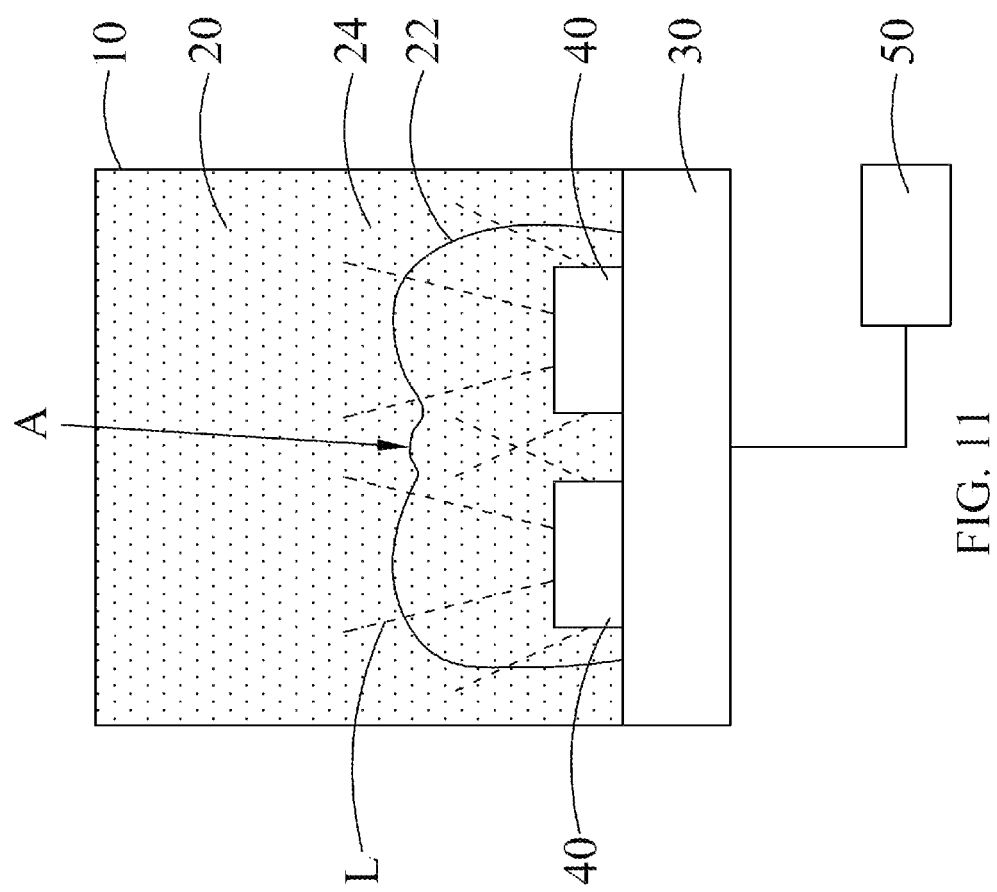
FIG. 11 is a schematic diagram of a third preferred embodiment of a method of manufacturing package component for light emitting diode of the present invention.

Please refer to FIG. 11 which is a schematic diagram of a third preferred embodiment of a method of manufacturing package component for light emitting diode of the present invention. Besides the preceding FIG. 4 demonstration, a user is able to dispose more than two light emitting diodes 40 on the substrate 30 based on the practical needs (amount of the light emitting diode 40 in the embodiment is two, but it shall not be subject to this restriction), and dispose these light emitting diodes 40 along with the substrate 30 inside the photocuring resin 20. When the power supply unit 50 provides a power to the light emitting diodes 40 to make the light emitting diodes emit the light beams L such that a portion of the photocuring resin 20 is cured by the light beams L to obtain a male mold 22. As shown in FIG. 11, as the light beams emitted from the two adjacent light emitting diodes 40 may simultaneously irradiate on area A of the photocuring resin 20, enabling that the light beams L irradiating the area A have additive property so as to be cured to form the male mold 22 as shown in FIG. 11. It not only can perform the package manufacturing process without aiming to each of different light emitting diodes 40 to reduce the processing time and cost, but also enable the light color of each light direction emitted from the multiple light emitting diodes 40 packaged on the same substrate 30 becoming more uniform and even through manufacturing the female mold by the male mold 22 obtained from the light type emitted from more than two light emitting diodes 40 and using the female mold to manufacture suitable package component. Besides this, the user is further able to adjust a distance between the two adjacent light emitting diodes 40 based on the practical needs so as to manufacture the continuous male mold 22 having the area A (shown in FIG. 11) or discontinuous male mold 22 without the area A (not shown in FIGS.).

In conclusion, a method of manufacturing package component for light emitting diode and a package structure thereof of the present invention is able to produce package components of consistent quality by the female mold manufactured by the male mold obtained from the light emitting diode emitting light itself so as to resolve technical problem concerning that the conventional LED package manufacturing process is lacking in consistent quality, as well as to promote the specification for the LED package structure such that the package components having excellent quality can be massively produced under the process conditions of high efficiency and low cost. In addition, manufacturing the female mold by the male mold obtained from the light type emitted from various LEDs, it can manufacture the necessary package component aiming to the luminous intensity of each light direction to make the light emission become more even.

While the means of specific embodiments in present invention has been described by reference drawings, numerous modifications and variations could be made thereto by those skilled in the art without departing from the scope and spirit of the invention set forth in the claims. The modifications and variations should in a range limited by the specification of the present invention.

What is claimed is:

1. A method of manufacturing package component for light emitting diode, comprising:
  disposing at least one light emitting diode disposed on a substrate inside a photocuring resin, wherein the light emitting diode is covered completely by the substrate and the photocuring resin;
  providing a power to the light emitting diode to make the light emitting diode emit a plurality of light beams such that a portion of the photocuring resin is cured by the light beams to obtain a male mold;
  performing a separation process to separate the male mold and the other portion of the photocuring resin, the light emitting diode and the substrate;
  performing a rollover process to manufacture the female mold by the male mold, wherein the female mold has at least one accommodation space with a shape identical to that of the male mold; and
  performing a forming process by utilizing the accommodation space to form a package component with a shape identical to that of the male mold.

2. The method of manufacturing package component for light emitting diode of claim 1, wherein the forming process comprises an injection forming process.

3. The method of manufacturing package component for light emitting diode of claim 1, wherein the forming process comprises:
  filling a colloid in the accommodation space of the female mold, and
  performing a thermal curing process or a thermoforming process to make the colloid form a package component with a shape identical to that of the male mold.

4. The method of manufacturing package component for light emitting diode of claim 1, wherein a wavelength conversion material is comprised inside the package component.

5. The method of manufacturing package component for light emitting diode of claim 1, wherein a light scattering material is comprised inside the package component.

6. The method of manufacturing package component for light emitting diode of claim 3, wherein the colloid is silica gel or epoxy resin.

7. The method of manufacturing package component for light emitting diode of claim 1, further comprising performing a cleaning process to the male mold between the separation process and the rollover process to remove the residual photocuring resin on the male mold.

8. The method of manufacturing package component for light emitting diode of claim 7, wherein the cleaning process utilizes an organic solvent to clean the male mold.

9. A package structure, comprising:
  a substrate,
  at least one light emitting diode disposed on the substrate, and
  a package component covering the light emitting diode, wherein the package component is obtained by a method of manufacturing package component for light emitting diode according to claim 1.

10. The package structure of claim 9, wherein each light emission point of the plurality of light beams emitted by the light emitting diode on a surface of the package component are identical in luminous intensity.

11. The package structure of claim 9, further comprising an adhesive layer disposed between the light emitting diode and the package component.

12. A package structure, comprising:
  a substrate,
  at least one light emitting diode disposed on the substrate, and
  a package component covering the light emitting diode, wherein the package component is obtained by a method of manufacturing package component for light emitting diode according to claim 4.

13. The package structure of claim 12, wherein each light emission point of the plurality of light beams emitted by the light emitting diode on a surface of the package component are identical in luminous intensity.

14. The package structure of claim 12, further comprising an adhesive layer disposed between the light emitting diode and the package component.

\* \* \* \* \*